US012356720B2

(12) United States Patent
Xu et al.

(10) Patent No.: US 12,356,720 B2
(45) Date of Patent: Jul. 8, 2025

(54) ARRAY SUBSTRATE, DISPLAY PANEL AND DISPLAY DEVICE

(71) Applicant: KunShan Go-Visionox Opto-Electronics Co., Ltd, Jiangsu (CN)

(72) Inventors: Chuanzhi Xu, Kunshan (CN); Zhengfang Xie, Kunshan (CN); Yong Wu, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 491 days.

(21) Appl. No.: 17/992,327

(22) Filed: Nov. 22, 2022

(65) Prior Publication Data

US 2023/0090854 A1 Mar. 23, 2023

Related U.S. Application Data

(63) Continuation of application No. PCT/CN2021/096369, filed on May 27, 2021.

(30) Foreign Application Priority Data

Aug. 14, 2020 (CN) .......................... 202010820314.1

(51) Int. Cl.
*H05K 1/18* (2006.01)
*H10D 86/40* (2025.01)
*H10D 86/60* (2025.01)

(52) U.S. Cl.
CPC .............. *H10D 86/60* (2025.01); *H05K 1/189* (2013.01); *H10D 86/441* (2025.01); *H05K 2201/10128* (2013.01)

(58) Field of Classification Search
CPC ...... H10D 86/60; H10D 86/441; H05K 1/189; H05K 2201/10128
(Continued)

(56) References Cited

U.S. PATENT DOCUMENTS 9,507,231 B2 * 11/2016 Ogasawara ......... G02F 1/13458

FOREIGN PATENT DOCUMENTS

CN 203982019 U 12/2014
CN 106057112 A 10/2016
(Continued)

OTHER PUBLICATIONS

International Search Report issued on Aug. 12, 2021, in corresponding International Application No. PCT/CN2021/096369, 6 pages.
(Continued)

*Primary Examiner* — Binh B Tran
(74) *Attorney, Agent, or Firm* — Maier & Maier, PLLC

(57) ABSTRACT

An array substrate, a display panel, and a display device. The array substrate includes a binding region, and the binding region includes a driving chip binding region and a flexible printed circuit binding region. The driving chip binding region is centrally distributed in the binding region, and the flexible printed circuit binding region is distributed on two sides of the driving chip binding region in a second direction. The driving chip binding region includes a first pad, a wiring region and a second pad sequentially distributed in the first direction. The first pad is arranged close to the first region. The second pad includes a second solder joint group and an isolation region, and the second solder joint group is located on two sides of the isolation region in the second direction.

18 Claims, 5 Drawing Sheets

(58) Field of Classification Search
USPC .......................................................... 361/767
See application file for complete search history.

(56) References Cited

FOREIGN PATENT DOCUMENTS

| | | | |
|---|---|---|---|
| CN | 110221462 | A | 9/2019 |
| CN | 110579917 | A | 12/2019 |
| CN | 110738934 | A | 1/2020 |
| CN | 111383554 | A | 7/2020 |
| CN | 111399290 | A | 7/2020 |
| CN | 111933030 | A | 11/2020 |
| CN | 112201155 | A | 1/2021 |
| KR | 20080053593 | A | 6/2008 |

OTHER PUBLICATIONS

Office Action issued on Jul. 23, 2021, in related Chinese Patent Application No. 202010820314.1, 17 pages.
Office Action issued on Feb. 28, 2022, in related Chinese Patent Application No. 202010820314.1, 14 pages.
Office Action issued on Jun. 6, 2022, in related Chinese Patent Application No. 202010820314.1, 9 pages.

* cited by examiner

ARRAY SUBSTRATE, DISPLAY PANEL AND DISPLAY DEVICE

CROSS-REFERENCE TO RELATED APPLICATION

The present application is a continuation of International Application No. PCT/CN2021/096369, filed on May 27, 2021, which claims priority to Chinese Patent Application No. 202010820314.1, filed on Aug. 14, 2020 and entitled "ARRAY SUBSTRATE, DISPLAY PANEL AND DISPLAY DEVICE", both of which are hereby incorporated by reference in their entireties.

TECHNICAL FIELD

The present application relates to a technical field of display technology, and in particular to an array substrate, a display panel and a display device.

BACKGROUND

In recent years, full screen has become the mainstream design solution in the display field and is favored by consumers. In order to increase the screen ratio, the narrower the lower border of the display screen, the better.

At present, there are three types of lower border binding schemes for display screens: COG (chip on glass), COF (chip on FPC) and COP (chip on plastic). Although the border is getting smaller and smaller, the cost is also getting higher and higher. Considering the cost, the lower border of the display screen currently on the market mainly adopts the COG (chip on glass) binding scheme. For the COG binding scheme, since both the driving chip (IC) and the flexible printed circuit (FPC) need to be bound on the lower border of the display panel, and the IC and the FPC need to be connected by wires, it is difficult to further reduce the lower border.

SUMMARY

The embodiments of the present application provide an array substrate, a display panel, and a display device, which is intended to reduce a width of a lower border of the display panel.

In an aspect, the embodiments of the present application provide an array substrate including a first region and a second region, wherein the second region is distributed around the first region, the second region includes a binding region adjacent to the first region in a first direction, and the binding region includes: a driving chip binding region and a flexible printed circuit binding region, wherein the driving chip binding region is centrally distributed in the binding region, and the flexible printed circuit binding region is distributed on two sides of the driving chip binding region in a second direction intersecting with the first direction, wherein the driving chip binding region includes a first pad, a wiring region and a second pad sequentially distributed in the first direction, wherein the first pad is arranged close to the first region, and the first pad includes a plurality of first solder joints arranged side by side along the second direction, and wherein the second pad includes a second solder joint group and an isolation region, the second solder joint group is located on two sides of the isolation region in the second direction, and the second solder joint group includes a plurality of second solder joints arranged side by side along the second direction; the second solder joints of the second solder joint group are connected to the flexible printed circuit binding region through wires, and the wires pass through the wiring region.

In another aspect, the embodiments of the present application provide a display panel including the array substrate according to any one of the above embodiments.

In a further aspect, the embodiments of the present application provide a display device including: the display panel according to any one of the above embodiments; a driving chip bound and connected to the driving chip binding region; a flexible printed circuit including a main portion and two connecting portions extending from one end of the main portion along the first direction, wherein the two connecting portions are respectively bound and connected to two flexible printed circuit binding regions.

According to the array substrate, the display panel and the display device provided by the embodiments of the present application, the array substrate has the binding region, and the binding region includes the driving chip binding region and the flexible printed circuit binding region. The flexible printed circuit binding region is arranged on two sides of the driving chip binding region in the second direction, which can reduce the space reserved in the array substrate along the first direction for the flexible printed circuit binding region and the wiring between the flexible printed circuit binding region and the driving chip binding region. Therefore, the width of the binding region in the first direction can be reduced, which is beneficial to realize the narrow border design of the display panel. Further, the isolation region is arranged between the second solder joint groups of the second pad of the driving chip binding region, so that the second solder joint groups configured to connect with the flexible printed circuit binding region move outward in the second direction, which can increase the space for the wiring region between the first pad and the second solder joint groups. Therefore, the layout requirements of the wires connecting the flexible printed circuit binding region and the second solder joint groups may be satisfied, and the problems such as wiring difficulty and easy interference between signals caused by insufficient wiring space may be reduced.

BRIEF DESCRIPTION OF THE DRAWINGS

The features, advantages and technical effects of the exemplary embodiments of the present application will be described below with reference to the accompanying drawings, which are not drawn to actual scale.

DETAILED DESCRIPTION

Figure 1:
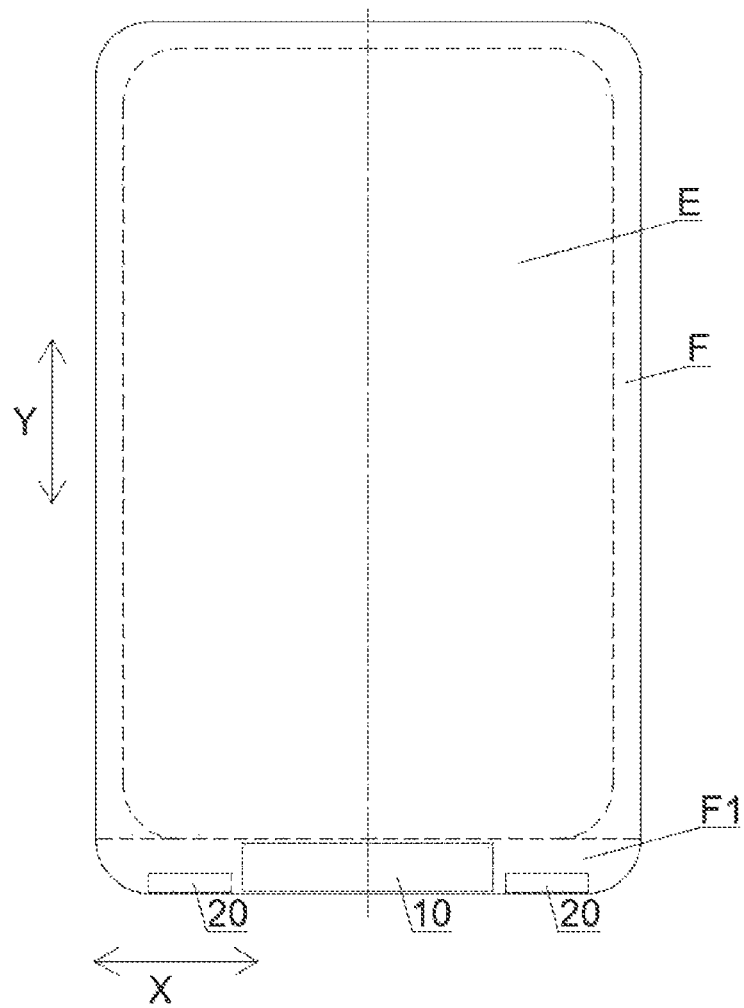
FIG. 1 illustrates a schematic structural diagram of an array substrate provided by an embodiment of the present application, wherein the binding region includes a driving chip binding region and a flexible printed circuit binding region.

Features and exemplary embodiments of various aspects of the present application are described in detail below. In the following detailed description, numerous specific details are set forth in order to provide a thorough understanding of the present application. However, it will be apparent to those skilled in the art that the present application may be practiced without some of these specific details. The following description of the embodiments is merely to provide a better understanding of the present application by illustrating examples of the present application. In the drawings and the following description, at least some well-known structures and techniques are not shown in order to avoid unnecessarily obscuring the present application; and, the dimensions of some structures may be exaggerated for clarity. Furthermore, the features, structures or characteristics described below may be combined in any suitable manner in one or more embodiments.

In recent years, display panels have mainly developed in the direction of high screen-to-body ratio and narrow borders. At present, there are three types of lower border binding schemes for display screens: COG (chip on glass), COF (chip on FPC) and COP (chip on plastic). Taking the COG binding scheme as an example, both the driving chip and the flexible printed circuit need to be bound on the lower border of the display panel. Since the driving chip and the flexible printed circuit are arranged along the width direction of the lower border, and space needs to be reserved for the wires connecting the driving chip and the flexible printed circuit in the width direction of the lower border, it is difficult to further reduce the lower border.

In order to better understand the present application, the array substrate, the display panel and the display device provided by the embodiments of the present application will be described in detail below with reference to FIGS. 1 to 6.

Figure 2:
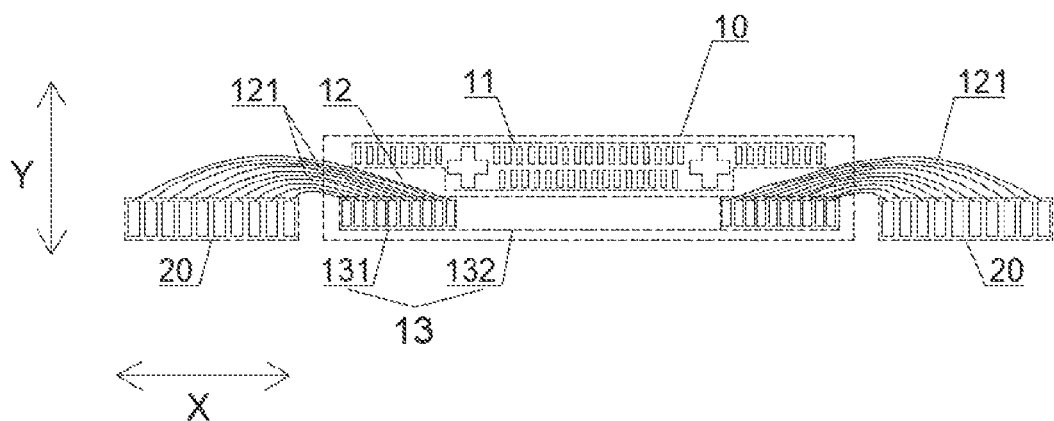
FIG. 2 illustrates a schematic structural diagram of a binding region of an array substrate provided by an embodiment of the present application, wherein the driving chip binding region includes a first pad, a wiring region, and a second pad sequentially distributed in a first direction Y.

The embodiments of the array substrate according to the present application are described below with reference to FIGS. 1 and 2. FIG. 1 illustrates a schematic structural diagram of an array substrate provided by an embodiment of the present application; and FIG. 2 illustrates a schematic structural diagram of a binding region of an array substrate provided by an embodiment of the present application.

The array substrate provided in the embodiments of the present application has a first region E and a second region F, the second region F is distributed around the first region E, and the second region F includes a binding region F1 adjacent to the first region E in the first direction Y.

The binding region F1 includes a driving chip binding region 10 and a flexible printed circuit binding region 20, the driving chip binding region 10 is centrally distributed in the binding region F1, and the flexible printed circuit binding region 20 is distributed on two sides of the driving chip binding region 10 in the second direction X intersecting with the first direction Y.

The driver chip binding region 10 may be a region on the array substrate for binding a driving chip, and the flexible printed circuit binding region 20 may be a region on the array substrate for binding a flexible printed circuit.

The driving chip bonding region 10 has a first pad 11, a wiring region 12 and a second pad 13 sequentially distributed in the first direction Y. The first pad 11 is arranged close to the first region E, the first pad 11 includes a plurality of first solder joints arranged side by side along the second direction X. The second pad 13 includes a second solder joint group 131 and an isolation region 132, the second solder joint group 131 is located on two sides of the isolation region 132 in the second direction X, and the second solder joint group 131 includes a plurality of second solder joints arranged side by side along the second direction X. The second solder joints of the second solder joint group 131 are connected to the flexible printed circuit binding region 20 through wires 121, and the wires 121 pass through the wiring region 12.

According to the array substrate provided by the embodiments of the present application, the flexible printed circuit binding region 20 is arranged on two sides of the driving chip binding region 10 in the second direction X, which can reduce the space reserved in the array substrate along the first direction Y for the flexible printed circuit binding region 20 and the wiring between the flexible printed circuit binding region 20 and the driving chip binding region 10. Therefore, the width of the binding region F1 in the first direction Y can be reduced, which is beneficial to realize the narrow border design of the display panel when the array substrate provided by the embodiments of the present application is applied to the display panel. Further, the isolation region 132 is arranged between the second solder joint groups 131 of the second pad 13, so that the second solder joint groups 131 configured to connect with the flexible printed circuit binding region 20 move outward in the second direction X, which can increase the space for the wiring region 12 between the first pad 11 and the second solder joint groups 131. Therefore, the layout requirements of the wires 121 connecting the flexible printed circuit binding region 20 and the second solder joint groups 131 may be satisfied, and the problems such as wiring difficulty and easy interference between signals caused by insufficient wiring space may be reduced.

In some optional embodiments, the first direction Y may be the length direction of the array substrate, the second direction X may be the width direction of the array substrate, and optionally, the first direction Y may be perpendicular to the second direction X.

Figure 3:
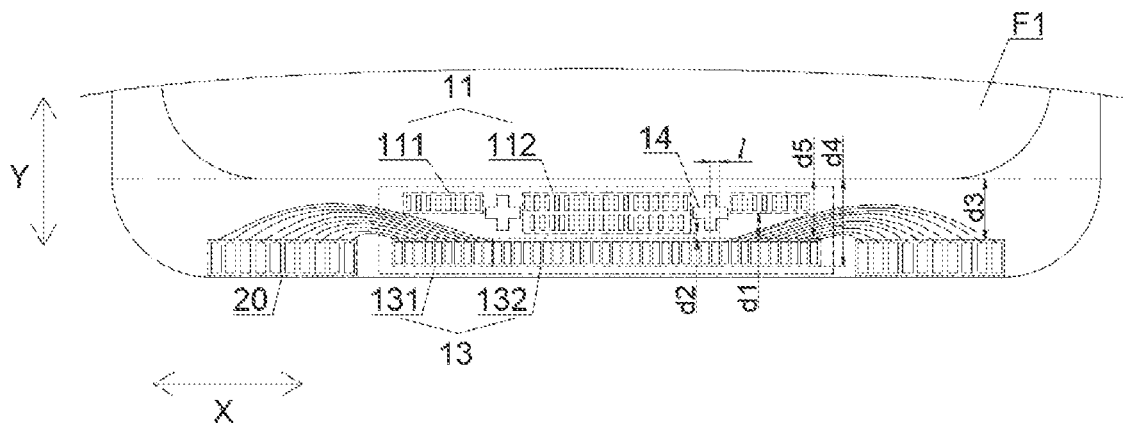
FIG. 3 illustrates a schematic structural diagram of a binding region of an array substrate provided by another embodiment of the present application, wherein a plurality of first solder joints of the first pad may be distributed in a second direction X as a middle solder joint group and a side solder joint group located on two sides of the middle solder joint group, and the first solder joints of the side solder joint group may be distributed in a column in the first direction Y.

The embodiments of the array substrate according to the present application are described below with reference to FIGS. 3 and 4. FIG. 3 illustrates a schematic structural diagram of a binding region of an array substrate provided by another embodiment of the present application; and FIG. 4 is a schematic structural diagram of a binding region of an array substrate provided by another embodiment of the present application.

As shown in FIG. 3, in some optional embodiments, the isolation region 132 of the second pad 13 may be provided with a plurality of dummy solder joints arranged side by side along the second direction X. Under a condition that the driving chip is arranged on the driving chip binding region 10 and the pins of the driving chip are bound and connected to the corresponding pad, the corresponding pins on the driving chip can be supported by the dummy solder joints.

Figure 4:
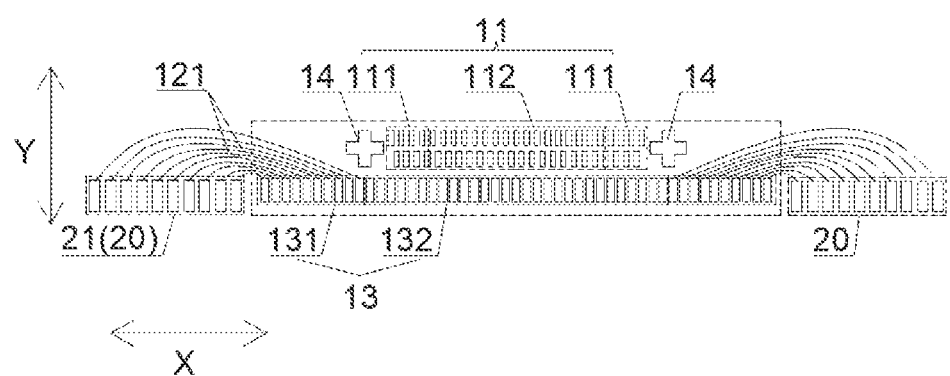
FIG. 4 illustrates a schematic structural diagram of a binding region of an array substrate provided by another embodiment of the present application, wherein the first solder joints of the side solder joint group may be distributed in multiple columns in the first direction Y.

As shown in FIGS. 3 and 4, in some optional embodiments, the plurality of first solder joints of the first pad 11 may be distributed in the second direction X as a middle solder joint group 112 and a side solder joint group 111 located on two sides of the middle solder joint group 112.

As shown in FIG. 3, optionally, the first solder joints of the side solder joint group 111 may be distributed in a column in the first direction Y.

As shown in FIG. 4, the first solder joints of the side solder joint group 111 may also be distributed in multiple columns in the first direction Y, which is also within the protection scope of the present application.

In some optional embodiments, in order to meet the wiring requirements of the wires 121, the minimum distance d1 between the side solder joint group 111 and the second pad 13 is greater than the minimum distance d2 between the middle solder joint group 112 and the second pad 13. Therefore, the wires 121 may be at least partially arranged in the region between the side solder joint group 111 and the second pad 13.

Optionally, in the first direction Y, the edge of the side solder joint group 111 close to the first region E may be level with the edge of the middle solder joint group 112 close to the first region E. Therefore, under a condition that the space occupied by the first pad 11 is not increased, the space between the side solder joint group 111 and the second pad 13 may be maximized.

The first solder joints of the middle solder joint group 112 may be distributed in one column in the first direction Y, or may be distributed in multiple columns. Optionally, in order to reduce the space occupied by the first pad 11 in the second direction X, the first solder joints of the middle solder joint group 112 are distributed in at least two columns in the first direction Y; meanwhile, in order to reduce the space occupied by the first pad 11 in the first direction Y, the first solder joints of the middle solder joint group 112 are distributed in at most three columns in the first direction Y.

Optionally, under a condition that the first solder joints of the middle solder joint group 112 are distributed in at least two columns in the first direction Y, gaps are arranged between the plurality of first solder joints in each column. For the first solder joints in two adjacent columns, the first solder joints in one column and the first solder joints in the other column may be staggered. Specifically, the first solder joints in one column and the first solder joints in the other column may be arranged alternately in the second direction X. This relatively compact arrangement of solder joints can reduce the space of the first pad 11 where the middle solder joint group 112 is located, which is beneficial to realize the narrow border design of the display panel.

As an optional implementation, the array substrate further includes scan lines and signal lines, and the plurality of first solder joints of the first pad 11 include signal line solder joints configured to connect with the signal lines of the array substrate and scan line solder joints configured to connect with the scan lines of the array substrate. Optionally, the first solder joints of the middle solder joint group 112 are the signal line solder joints, and the first solder joints of the side solder joint group 111 are the scan line solder joints, so as to facilitate wiring.

Please continue to refer to FIGS. 3 and 4, in some optional embodiments, in order to facilitate accurate binding of the driving chip, the driving chip binding region 10 is further provided with at least two alignment marks 14 located between the first pad 11 and the wiring region 12.

Optionally, the shape of the alignment marks 14 may be a cross, a trapezoid, a square or any other suitable shape, which is not specifically limited in the present application.

Optionally, under a condition that the first solder joints of the side solder joint group 111 are distributed in a column in the first direction Y, in order to prevent the alignment marks 14 from interfering with the arrangement of the wires 121, the alignment marks 14 may be arranged above the wiring region 12 and between the middle solder joint group 112 and the side solder joint group 111.

Optionally, under a condition that the first solder joints of the side solder joint group 111 are distributed in multiple columns in the first direction Y, the alignment marks 14 may be arranged above the wiring region 12 and on two sides of the first pads 11. Of course, the alignment mark 14 may also be arranged above the wiring region 12 and between the middle solder joint group 112 and the side solder joint group 111, which is also within the protection scope of the present application.

In some optional embodiments, in the second direction X, the alignment marks 14 are located near the corresponding endpoints of the isolation region 132 in the second direction X, so that the wiring region 12 above the second solder joint group 131 satisfies the wiring requirements of the wires 121.

Optionally, the distance l between an orthographic projection of an alignment mark 14 on the isolation region 132 in the first direction Y and a corresponding endpoint of the isolation region 132 in the second direction X is 0 mm~1 mm.

In some optional embodiments, the distance l between the orthographic projection of the alignment mark 14 on the isolation region 132 in the first direction Y and the corresponding endpoint of the isolation region 132 in the second direction X may refer to a distance l between an orthographic projection of the center of the alignment mark 14 on the isolation section 132 and the corresponding endpoint of the isolation region 132 in the second direction X.

In some optional embodiments, the flexible printed circuit binding region 20 may be provided with a third pad 21. The third pad 21 includes a plurality of third solder joints arranged side by side along the second direction X, and the third solder joints of the third pad are connected to the second solder joints of the second pad 13 in a one-to-one correspondence.

The third solder joints of the third pad 21 may be distributed in a column in the first direction Y, or may be distributed in multiple columns.

In some optional embodiments, a minimum distance d3 from the first region E to an edge of the third pad 21 close to the first region E is less than or equal to a minimum distance d4 from the first region E to an edge of the second pad 13 away from the first region E. Therefore, the space of the binding region F1 required to be reserved for the third pad 21 in the first direction Y may be reduced, and the width of the binding region F1 in the first direction Y may be reduced.

Optionally, the minimum distance d3 from the first region E to an edge of the third pad 21 close to the first region E is less than or equal to a minimum distance d5 from the first region E to an edge of the second pad 13 close to the first region E, so as to further reduce the width of the binding region F1 in the first direction Y.

In addition, the embodiments of the present application further provide a display panel including the aforementioned array substrate. The display panel may be an organic light emitting diode (OLED) display panel, or a liquid crystal (LCD) display panel.

Figure 5:
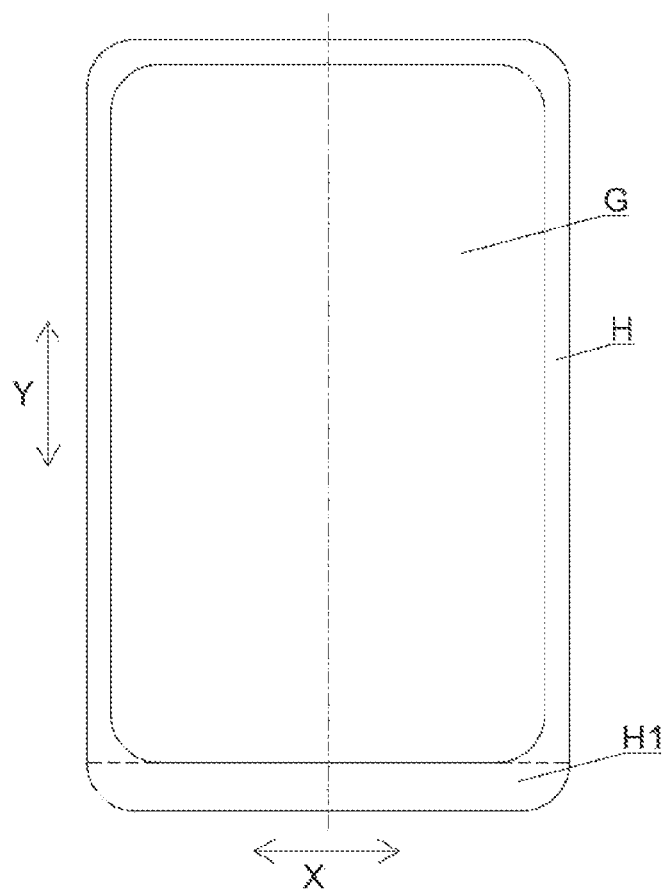
FIG. 5 illustrates a schematic structural diagram of a display panel provided by an embodiment of the present application.

FIG. 5 illustrates a schematic structural diagram of a display panel provided by an embodiment of the present application. As shown in FIG. 5, the display panel may include a display region G and a non-display region H, the first region E of the array substrate is arranged corresponding to the display region G of the display panel, and the second region F is arranged corresponding to the non-display region H of the display panel.

In some optional embodiments, the binding region F1 is arranged corresponding to the lower border region H1 of the display panel.

In some optional embodiments, the first direction Y may be the width direction of the lower border region H1, and the second direction X may be the length direction of the lower border region H1.

According to the display panel provided by the embodiments of the present application, the display panel includes the array substrate provided in the above embodiments. In the array substrate, the flexible printed circuit binding region 20 is arranged on two sides of the driving chip binding region 10 in the second direction X. Therefore, the width of the binding region F1 in the first direction Y can be reduced, and the width of the lower border region H1 of the display panel can be narrowed, which can meet the narrow border requirements.

Figure 6:
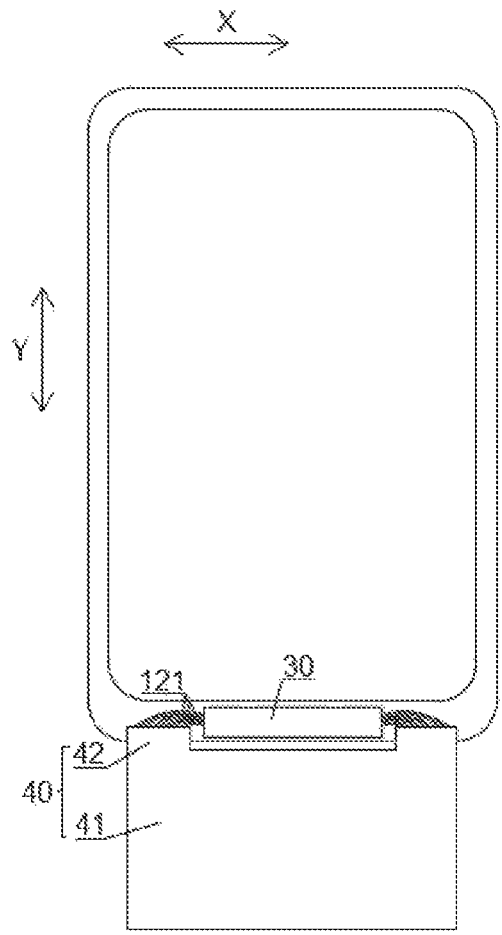
FIG. 6 illustrates a schematic structural diagram of a display device provided by an embodiment of the present application.

In addition, the embodiments of the present application further provide a display device. FIG. 6 illustrates a schematic structural diagram of a display device provided by an embodiment of the present application; and FIG. 7 illustrates a schematic structural diagram of a driving chip of a display device provided by an embodiment of the present application.

As shown in FIG. 6, the display device according to the embodiments of the present application include: the display panel provided by the above embodiments; a driving chip 30 bound and connected to the driving chip binding region 10; and a flexible printed circuit 40 including a main portion 41 and two connecting portions 42 extending from one end of the main portion 41 along the first direction Y, wherein the two connecting portions 42 are respectively bound and connected to two flexible printed circuit binding regions 20.

Figure 7:
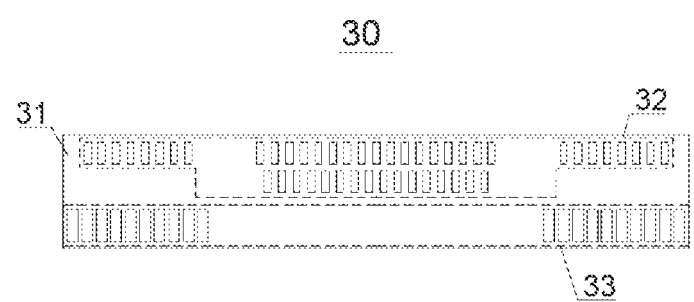
FIG. 7 illustrates a schematic structural diagram of a driving chip of a display device provided by an embodiment of the present application.

As shown in FIG. 7, in some optional embodiments, the driving chip 30 includes a chip base 31 and a first binding pin group 32 and a second binding pin group 33 arranged on the chip base 31. The first binding pin group 32 is located on one side of the second binding pin group 33 in the first direction Y, the first binding pin group 32 includes a plurality of first binding pins arranged side by side along the second direction X, and the second binding pin group 33 includes a plurality of second binding pins arranged side by side along the second direction X. Under a condition that the driving chip 30 is bound and connected to the driving chip binding region 10, the first binding pins of the first binding pin group 32 are bound and connected to the first solder joints of the first pad 11 in a one-to-one correspondence, and the second binding pins of the second binding pin group 33 are bound and connected to the second solder joints of the second pad 13 in a one-to-one correspondence.

In some optional embodiments, the two connecting portions 42 of the flexible printed circuit 40 may be provided with a plurality of connecting pins arranged side by side along the second direction X. Under a condition that the flexible printed circuit binding region 20 of the array substrate is provided with the third pad 21 and the connecting portions 42 of the flexible printed circuit 40 are bound and connected to the flexible printed circuit binding region 20, the connecting pins of the connecting portions 42 are bound and connected to the third solder joints of the third pad 21 in a one-to-one correspondence.

Those skilled in the art should understand that the above-mentioned embodiments are all exemplary rather than restrictive. Different technical features presented in different embodiments may be combined to achieve advantageous effects. Those skilled in the art should be able to understand and implement other modified embodiments of the disclosed embodiments on the basis of studying the drawings, the description, and the claims. The functions of multiple portions presented in the claims can be implemented by a single hardware or software module. The mere presence of certain technical features in different dependent claims does not imply that these features cannot be combined to advantage.

What is claimed is:

1. An array substrate comprising a first region and a second region, wherein the second region is distributed around the first region, the second region comprises a binding region adjacent to the first region in a first direction, and the binding region comprises:
   a driving chip binding region and a flexible printed circuit binding region, wherein the driving chip binding region is distributed in the binding region, and the flexible printed circuit binding region is distributed on two sides of the driving chip binding region in a second direction intersecting with the first direction,
   wherein the driving chip binding region comprises a first pad, a wiring region and a second pad sequentially distributed in the first direction, wherein the first pad is arranged close to the first region, and the first pad comprises a plurality of first solder joints arranged side by side along the second direction, and wherein the second pad comprises a second solder joint group and an isolation region, the second solder joint group is located on two sides of the isolation region in the second direction, and the second solder joint group comprises a plurality of second solder joints arranged side by side along the second direction;
   the second solder joints of the second solder joint group are connected to the flexible printed circuit binding region through wires, and the wires pass through the wiring region.

2. The array substrate according to claim 1, wherein the isolation region is provided with a plurality of dummy solder joints arranged side by side along the second direction.

3. The array substrate according to claim 1, wherein the plurality of first solder joints of the first pad are distributed in the second direction and comprise a middle solder joint group and a side solder joint group located on two sides of the middle solder joint group.

4. The array substrate according to claim 3, wherein the array substrate further comprises a plurality of scan lines and signal lines, and the plurality of first solder joints of the first pad comprise signal line solder joints configured to connect with the signal lines and scan line solder joints configured to connect with the scan lines, wherein the first solder joints of the middle solder joint group are performed as the signal line solder joints, and the first solder joints of the side solder joint group are performed as the scan line solder joints.

5. The array substrate according to claim 3, wherein the first solder joints of the side solder joint group are distributed in a column in the first direction.

6. The array substrate according to claim 3, wherein a minimum distance between the side solder joint group and the second pad is greater than a minimum distance between the middle solder joint group and the second pad.

7. The array substrate according to claim 3, wherein in the first direction, an edge of the side solder joint group close to the first region is flush with an edge of the middle solder joint group close to the first region.

8. The array substrate according to claim 3, wherein the first solder joints of the middle solder joint group are distributed in at least two columns in the first direction, wherein gaps are arranged between the plurality of first solder joints in each column, and the first solder joints in two adjacent columns are staggered.

9. The array substrate according to claim 3, wherein the driving chip binding region is further provided with at least two alignment marks located between the first pad and the wiring region.

10. The array substrate according to claim 9, wherein the first solder joints of the side solder joint group are distributed in a column in the first direction, and the alignment marks are arranged above the wiring region and between the middle solder joint group and the side solder joint group.

11. The array substrate according to claim 9, wherein the first solder joints of the side solder joint group are distributed in multiple columns in the first direction, and the alignment marks are arranged above the wiring region and on two sides of the first pad, or the alignment marks are arranged above the wiring region and between the middle solder joint group and the side solder joint group.

12. The array substrate according to claim 9, wherein a distance between an orthographic projection of an alignment mark on the isolation region in the first direction and a corresponding endpoint of the isolation region in the second direction is 0 mm~1 mm.

13. The array substrate according to claim 1, wherein the flexible printed circuit binding region is provided with a third pad, wherein the third pad comprises a plurality of third solder joints arranged side by side along the second direction, and the third solder joints of the third pad are connected to the second solder joints.

14. The array substrate according to claim 13, wherein a minimum distance from the first region to an edge of the third pad close to the first region is less than or equal to a minimum distance from the first region to an edge of the second pad away from the first region.

15. The array substrate according to claim 14, wherein a minimum distance from the first region to an edge of the third pad close to the first region is less than or equal to a minimum distance from the first region to an edge of the second pad close to the first region.

16. A display panel comprising the array substrate according to claim 1.

17. A display device comprising:
the display panel according to claim 16;
a driving chip bound and connected to the driving chip binding region;
a flexible printed circuit comprising a main portion and two connecting portions extending from one end of the main portion along the first direction, wherein the two connecting portions are respectively bound and connected to two flexible printed circuit binding regions.

18. The display device according to claim 17, wherein the driving chip comprises a chip base and a first binding pin group and a second binding pin group arranged on the chip base, wherein the first binding pin group is located on one side of the second binding pin group in the first direction, the first binding pin group comprises a plurality of first binding pins arranged side by side along the second direction, and the second binding pin group comprises a plurality of second binding pins arranged side by side along the second direction, and wherein the first binding pins of the first binding pin group are bound and connected to the first solder joints of the first pad in a one-to-one correspondence, and the second binding pins of the second binding pin group are bound and connected to the second solder joints of the second pad in a one-to-one correspondence.

* * * * *